US007359415B1

(12) United States Patent
Alfano et al.

(10) Patent No.: US 7,359,415 B1
(45) Date of Patent: Apr. 15, 2008

(54) CR$^{4+}$-DOPED MIXED ALLOY LASER MATERIALS AND LASERS AND METHODS USING THE MATERIALS

(75) Inventors: Robert R. Alfano, Bronx, NY (US); Vladimir Petricevic, New York, NY (US); Alexey Bykov, Bronx, NY (US)

(73) Assignee: Research Foundation of the City University of New York, New York, NY (US)

( * ) Notice: Subject to any disclaimer, the term of this patent is extended or adjusted under 35 U.S.C. 154(b) by 199 days.

(21) Appl. No.: 11/338,478

(22) Filed: Jan. 24, 2006

Related U.S. Application Data

(60) Provisional application No. 60/646,546, filed on Jan. 25, 2005.

(51) Int. Cl.
*H01S 3/14* (2006.01)
(52) U.S. Cl. .......................................... 372/39; 372/41
(58) Field of Classification Search .................. 372/39, 372/41
See application file for complete search history.

(56) References Cited

U.S. PATENT DOCUMENTS 4,932,031 A   6/1990  Alfano et al.
4,987,575 A   1/1991  Alfano et al.

OTHER PUBLICATIONS

Angert et al., "Lasing Due to Impurity Color Centers in Yttrium Aluminum Garnet Crystals at Wavelengths in the Range 1.35-1.45μm," *Soviet J. Quantum Electronics*, 18(1):73-74 (1988).
Brauch et al., "Multiwatt Diode-pumped Yb:YAG Thin Disk Laser Continuously Tunable Between 1018 and 1053 nm," *Opt. Lett.*, 20(7):713-715 (1995).
Chen et al., "Growth Mechanism of Cr:forsterite Laser Crystal with High Cr Concentration," *Optical Materials*, 24:163-168 (2003).
Deka et al., "Laser Performance of Cr$^{4+}$:Y$_2$SiO$_5$," *Applied Physics Letters*, 61(18):2141-2143 (1992).
Feldman et al., "Dynamics of Chromium Ion Valence Transformations in Cr,Ca:YAG Crystals used as Laser Gain and Passive Q-switching Media," *Optical Materials*, 24:333-344 (2003).
Hazenkamp et al., "Optical Spectroscopy of Cr$^{4+}$-doped Ca$_2$GeO$_4$ and Mg$_2$SiO$_4$," *Phys. Rev.*, 53(5):2367-2377 (1996).

(Continued)

*Primary Examiner*—Dung T. Nguyen
(74) *Attorney, Agent, or Firm*—Darby & Darby P.C.; Bruce E. Black

(57) ABSTRACT

A laser medium includes a single crystal of Cr$^{4+}$:Mg$_{2-x}$M$_x$Si$_{1-y}$A$_y$O$_4$, where, where M is a bivalent ion having an ionic radius larger than Mg$^{2+}$, and A is a tetravalent ion having an ionic radius larger than Si$^{4+}$. In addition, either a) $0 \leq x < 2$ and $0 < y < 1$ or b) $0 < x < 2$ and y is 0 or 1 with the proviso that if M is Ca$^{2+}$ and x=1 then y is not 0. The laser medium can be used in a laser device, such as a tunable near infrared (NIR) laser.

22 Claims, 5 Drawing Sheets

OTHER PUBLICATIONS

Jia et al., "Spectroscopy of $Cr^{3+}$ and $Cr^{4+}$ Ions in Forsterite," *Phys. Rev.*, 43(7):5234-5242 (1991).

Koetke et al., "Quasi-continuous Wave Laser Operation of $Cr^{4+}$-doped $Y_2SiO_5$ at Room Temperature," *Optics Communication*, 101(3,4):195-198 (1993).

Kuck et al., "Tunable Room-Temperature Lasr Action of $Cr^{4+}$-doped $Y_3Sc_xAl_{5-x}O_{12}$," *Appl. Phys. B.*, 58:153-156 (1994).

Lai, S. T., "Highly Efficient Emerald Laser," *J. Opt. Soc. Am. B.*, 4(8):1286-1290 (1987).

Mass et al., "Oxygen Activity Dependence of the Chromium (IV) Population in Chromium-doped Forsterite Crystals Grown by the Floating Zone Technique," *J. of Crystal Growth*, 165(3):250-257 (1996).

Moulton, P. F., "Spectroscopic and Laser Characteristics of $Ti:Al_2O_3$," *J. Opt. Soc. Am. B.*, 3(1):125-133 (1986).

Payne et al., "Laser Performance of $LiSrAlF_6:Cr^{3+}$," *J. Appl.Phys.*, 66(3):1051-1056 (1989).

Payne et al., "$LiCaAlF_6:Cr^{3+}$: A Promising New Solid-State Laser Material," *J. Quant. Elect.*, 24(11):2243-2252 (1988).

Payne et al., "Optical Spectroscopy of the New Laser Materials, $LiSrAlF_6:Cr^{3+}$ and $LiCaAlF_6:Cr^{3+}$," *J. Luminescence*, 44:167-176 (1989).

Petricevic et al., "Laser Action in Chromium-activated Forsterite for Near-infrared Excitation: Is $Cr_{4+}$ the Lasing Ion?," *Appl. Phys. Lett.*, 53(26):2590-2592 (1988).

Petricevic et al., "Pulsed Laser Operation of $Cr^{4+}:LiScGeO_4$ at 1.3 µm," CLEO 97, CTuE7 9:30AM, pp. 77-78 (1997).

Petricevic et al., "Room-temperature Near-Infrared Tunable Laser Operation of $Cr_{4+}:Ca_2GeO_4$," *Opt. Lett.*, 21(21):1750-1752 (1996).

Robbins et al., "The System Magnesium Oxide-germanium Dioxide," *Amer. J. Science*, 257:63-70 (1959).

Schafer et al., "Organic Dye Solution Laser," *Appl. Phys. Lett.*, 9(8):306-309 (1966).

Shkadarevich, A. P., "Recent Advances in Tunable Solid State Lasers," *Opt. Soc. Amer.*, 5:60-65 (1989).

Voss et al., "Efficient High-power Diode-pumped Thin-disk Yb:YAG-Laser," *Proc SPIE*, 2426:501-508 (1995).

Walling et al., "Tunable CW Alexandrite Laser," *IEEE J. Quant. Elect.*, QE-16(2):120-121 (1980).

CR$^{4+}$-DOPED MIXED ALLOY LASER MATERIALS AND LASERS AND METHODS USING THE MATERIALS

RELATED APPLICATIONS

This patent application claims the benefit of U.S. Provisional Patent Application Ser. No. 60/646,546, filed Jan. 25, 2005, incorporated herein by reference.

STATEMENT REGARDING FEDERALLY SPONSORED RESEARCH OR DEVELOPMENT

This invention was made with government support under Grant No. NCC-1-03009 awarded by NASA and Grant No. W911NF0410023 from the U.S. Department of Defense. The government may have certain rights in this invention.

BACKGROUND

The development of tunable solid state lasers based on the Cr$^{4+}$-ion started in 1988 with forsterite, Cr:Mg$_2$SiO$_4$ [V. Petricevic, S. K. Gayen and R. R. Alfano, Appl. Phys. Letters 53 (1988) 2590]. It was extended to other crystalline media, such as Cr$^{4+}$-doped Y$_3$Al$_5$O$_{12}$ [A. P. Shkadarevich, in: OSA Proceedings on Tunable Solid State Lasers, Ed. M. L. Shand and H. P. Jenssen (Optical Society of America, Washington, D. C., 1989), Vol. 5, pp. 60-65], Y$_2$SiO$_5$ [J. Koetke, S. Kuck, K. Petermann, G. Huber, G. Gerullo, M. Danailov, V. Magni, L. F. Qian, and O. Svelto, Opt. Commun. 101 (1993) 195], and Y$_3$Sc$_x$Al$_{5-x}$O$_{12}$ [S. Kuck, K. Peterman, U. Pohlmann, U. Schonhoff, and G. Huber, Appl. Phys. B58, (1994) 153]. These materials also typically include the chromium dopant within the crystalline structure in other valence states. These other valence states can act as a trap and reduce the total concentration of Cr$^{4+}$ lasing ions. Increasing Cr$^{4+}$ lasing ion concentration in the laser materials can improve efficiency of laser devices.

Different approaches have been used to increase Cr$^{4+}$ concentration in crystals. For example, specific crystal growth conditions have been created using different total amounts of chromium oxide in the initial charge, different oxygen content in the growth atmosphere, and/or different after-growth heat treatments. Possible mechanisms for chromium ion incorporation in a crystal structure, with appropriate charge compensation, have also been discussed (W. Chen and G. Boulon, Growth mechanism of Cr:forsterite laser crystal with high Cr concentration, *Optical Materials.* 24 (2003) 163-168; R. Feldman, Y. Shimony and Z. Burshtein. Dynamics of chromium ion valence transformations in Cr,Ca:YAG crystals used as laser gain and passive Q-switching media *Optical Materials,* Volume 24, Issues 1-2, October-November 2003, Pages 333-334; J. L. Mass, J. M. Burlitch, S. A. Markgraf, M. Higuchi, R. Dieckmann, D. B. Barber and C. R. Pollock, Oxygen activity dependence of the chromium (IV) population in chromium-doped forsterite crystals grown by the floating zone technique, *Journal of Crystal Growth,* Volume 165, Issue 3, 1 Aug. 1996, Pages 250-25).

BRIEF SUMMARY

One embodiment is a laser medium, comprising a single crystal of Cr$^{4+}$:Mg$_{2-x}$M$_x$Si$_{1-y}$A$_y$O$_4$, where M is a bivalent ion having an ionic radius larger than Mg$^{2+}$, and A is a tetravalent ion having an ionic radius larger than Si$^{4+}$. In addition, either a) $0 \leq x<2$ and $0<y<1$ or b) $0<x<2$ and y is 0 or 1 with the proviso that if M is Ca$^{2+}$ and x=1 then y is not 0.

Another embodiment is a laser, such as a tunable near infrared laser, that contains the laser medium.

Yet another embodiment is a method of making a laser medium. The method includes forming a solution comprising at least one substituent for forming the laser medium disposed in a solvent, wherein the at least one substituent is a metal oxide. At least one crystal of Cr$^{4+}$:Mg$_{2-x}$M$_x$Si$_{1-y}$A$_y$O$_4$ is formed from the solution, where M is a bivalent ion having an ionic radius larger than Mg$^{2+}$, and A is a tetravalent ion having an ionic radius larger than Si$^{4+}$. In addition, either a) $0 \leq x<2$ and $0<y<1$ or b) $0<x<2$ and y is 0 or 1 with the proviso that if M is Ca$^{2+}$ and x=1 then y is not 0. In one embodiment, the method includes providing a substrate; and forming a layer of Cr$^{4+}$:Mg$_{2-x}$M$_x$Si$_{1-y}$A$_y$O$_4$ on the substrate by liquid phase epitaxy.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

Figure 1:
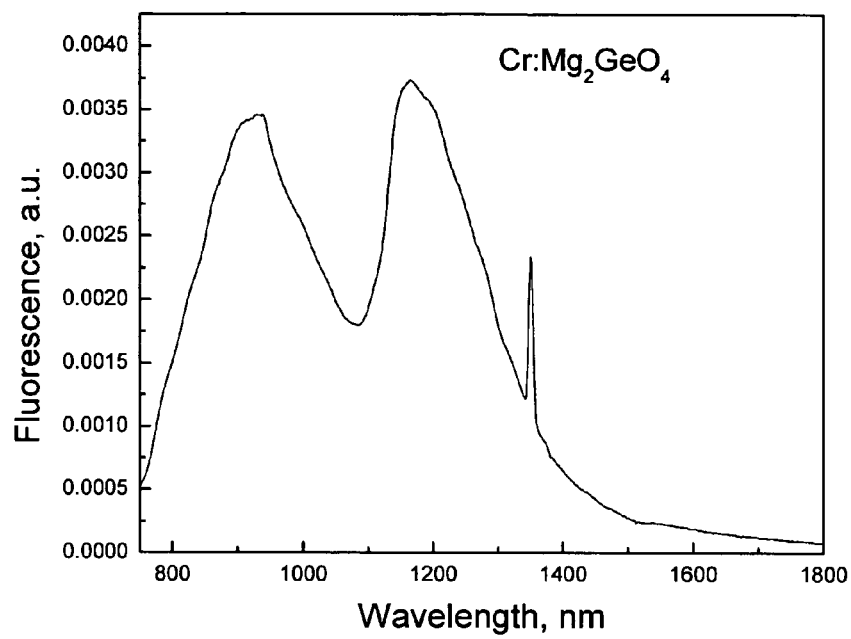
FIG. 1 is a fluorescence spectrum of a chromium-doped Mg$_2$GeO$_4$ powder sample.

New laser materials, including near infrared (NIR) laser materials, can be based on alloys of forsterite (Mg$_2$SiO$_4$). These materials can be used as chromium doped laser materials (e.g., laser media) for lasers, such as tunable NIR lasers. Increased Cr$^{4+}$ concentrations can often be achieved by certain isomorphic substitutions which provide enhanced Cr$^{4+}$ incorporation conditions in the forsterite crystal structure. Examples of a suitable laser medium (material) is the Cr-doped mixed alloy single crystal composition, Mg$_{2-x}$M$_x$Si$_{1-y}$A$_y$O$_4$, which has an olivine-type crystal structure. In this alloy, M=Ca, Sr, Ba or any other bivalent ions with a larger ionic radius than Mg$^{2+}$, and A=Ge, Ti, Zr or any other tetravalent ions with a larger ionic radius than Si$^{4+}$.

For these materials, either a) $0 \leq x<2$ and $0<y<1$ or b) $0<x<2$ and y is 0 or 1 with the proviso that if M is Ca$^{2+}$ and x=1 then y is not 0. In some embodiments, $0<x<2$ or $0.1 \leq x \leq 1.9$ or $0.1 \leq x \leq 1$. In some embodiments, $0.1 \leq y \leq 0.9$. In some embodiments, $0.1 \leq x \leq 1.9$ and $0.1 \leq y \leq 0.9$.

In some embodiments, the single crystal can have at least 0.05 wt. % $Cr^{4+}$ and may have at least 0.1 wt. %, 0.5 wt. %, or 1 wt. % $Cr^{4+}$ or more. In some embodiments, the single crystals have 1 to 5 wt. % $Cr^{4+}$.

In the past, the laser operation of chromium-doped forsterite (Cr:$Mg_2SiO_4$) was attributed to the $Cr^{4+}$ ion substituting for $Si^{4+}$ in the tetrahedrally coordinated sites of the forsterite structure. Unfortunately, there is also typically $Cr^{3+}$ substitution for $Mg^{2+}$ in the octahedrally coordinated sites. By controlling the crystal growth process (oxidizing atmosphere, crystal growth direction, etc.) the $Cr^{4+}/Cr^{3+}$ ratio may be increased, but the total amount (e.g., concentration) of $Cr^{4+}$ in forsterite typically stays at a relatively low level (typically not exceeding 0.05 wt. %). The presence of larger divalent ions, such as $Ca^{2+}$, can promote the formation of an optically active $Cr^{4+}$ center.

Synthesis, crystal growth and successful laser operation of another $Cr^{4+}$-doped crystal, $Ca_2GeO_4$, also having the olivine structure, has been studied. (V. Petricevic, A. B. Bykov, J. M. Evans and R. R. Alfano *Optics Letters* 21 (1996), p. 1750). This material demonstrated that the crystalline structure, including the geometry of octahedral and tetrahedral sites, is a prominent factor for $Cr^{4+}$ incorporation (e.g., substitution) in the crystal structure. The composition of the laser material defines the parameters of the crystalline structure which determines the fit of the $Cr^{4+}$-ions in the tetrahedral sites. The composition can provide the conditions for improving $Cr^{4+}$ concentration in a laser crystal. Growth conditions such as temperature and growth atmosphere seem to be secondary factors.

Spectroscopic studies of different alloys of Cr-doped olivines related to forsterite show changes of fluorescence properties demonstrating that the $Cr^{4+}/Cr^{3+}$ ratio depends on composition of the material. For example, a number of powder samples of Cr-doped $Mg_2GeO_4$ were synthesized by solid state reaction. Synthesis was carried out at 1400° C. for 20 hours in a muffle furnace in an air atmosphere. The initial powder mixture contained stoichiometric amounts of MgO and $GeO_2$ doped with ~1 wt % $Cr_2O_3$. The cooling rate was varied from fast quenching (e.g., crucibles with the material were taken out from the hot furnace) to slow cooling from 1400° C. to room temperature over a period ranging up to 48 hours. X-ray powder diffraction analysis did not reveal any structural difference for quenched and slow cooled samples. Only the olivine structure was observed without any traces of a spinel structure.

Differential thermal analysis (DTA) experiments were also conducted to detect any polymorphic transitions. The experiments included very slow heating and cooling conditions around 800° C. No thermal anomalies have been found for the samples. As a result, no evidence of a spinel structure was revealed by this DTA study.

Fluorescence measurements, illustrated in FIG. 1, have been made for the samples. These measurements also confirmed the presence of only the olivine structure of Cr-doped $Mg_2GeO_4$. The spectrum consisted of two broad bands attributed to emission from $Cr^{3+}$ ions in octahedral occupation (maximum at 925 nm) and from $Cr^{4+}$ ions in tetrahedral occupation (maximum at 1170 nm). The sharp line at 1360 nm is the $2^{nd}$ order emission of the pump diode laser (680 nm).

In view of the results of the X-ray diffraction, DTA, and fluorescence measurements on the powder samples, the olivine type structure of $Mg_2GeO_4$ is very stable and only this type of structure is formed during the synthesis procedure. Heating and cooling procedures do not lead to spinel transformation as demonstrated in the MgO—$GeO_2$ diagram of the system. [C. R. Robbins and E. M. Levin, *Am. J. Sci.*, 257, 65 (1959).]

A number of Cr-doped alloy $Mg_2Ge_{1-y}Si_yO_4$ powder samples (where y varies from 0.1 to 0.9) were generated and lattice parameters were measured using standard X-ray diffraction technique together with fluorescence measurements. It was found that the lattice parameters generally change linearly with substitution (y=0 to y=1) from pure $Mg_2GeO_4$ to pure $Mg_2SiO_4$. Fluorescence measurements revealed a very interesting feature concerning $Cr^{3+}$ and $Cr^{4+}$ distribution in these materials. As can be seen from FIG. 2, the emission of $Cr^{3+}$ is suppressed ($Cr^{3+}/Cr^{4+}$ ratio is decreased) for the samples with a composition approaching a Si/Ge ratio equal to 1. In addition, the wavelength of maximum $Cr^{4+}$ emission shifts to longer wavelength with increasing germanium content in the samples. (The sharp line at 1360 nm is the $2^{nd}$ order emission of the pump diode laser (680 nm).)

Laser materials can be formed by a variety of methods including, but not limited to, liquid phase epitaxy. For oxide materials, one example of the LPE process is the following: The constituents of the solution are melted in a platinum crucible at about 50-100° C. above the saturation temperature. For example, the solution can include a solvent and stoichiometric quantities of the desired reactants, such as germanium oxide, silicon oxide, magnesium oxide, and chromium oxide (or mixed oxides such as $Mg_2SiO_4$ or $Mg_2GeO_4$) in the desired stoichiometric amounts. Before growth, the melt is stirred to provide complete dissolution of solute components. The substrate is mounted horizontally on a platinum holder and preheated in the furnace. The substrate has an alternate rotation of 50-100 rpm with a change every 5-10 s. Before dipping, in order to limit the temperature fluctuations, the substrate is to stay a few minutes above the melt. During growth, the melt temperature is kept constant. After the growth a rapid speed rotation (800 rpm) should be used in order to eliminate the solvent droplets. Then the substrate is pulled out of the furnace slowly in order to avoid thermal stresses.

Two types of solvent, based on PbO and $Bi_2O_3$, were tested. The test method was based on preparation of a number of compositions in "Solvent (PbO or $Bi_2O_3$)—Solute (Cr:$Mg_2GeO_4$)" systems with different concentrations of solute and then undergoing a heating procedure until partial melting occurred. It was found that PbO did not generally provide good crystallization parameters, but $Bi_2O_3$ proved to be very promising, because even compositions with Cr:$Mg_2GeO_4$ content less that 10 mol. % were characterized by crystallization of Cr:$Mg_2GeO_4$. The presence of Cr:$Mg_2GeO_4$ micro-crystals in solidified samples were detected by measurement of emission properties.

A starting composition for crystal growth of Cr:$Mg_2GeO_4$ was the following: MgO—0.025 mol., $GeO_2$—0.025 mol., $Bi_2O_3$—0.25 mol., $Cr_2O_3$—0.0075 mol. Crystallization temperature for this composition was below 1050° C. It was found that $Mg_2SiO_4$ crystal placed in the melt did not exhibit any traces of dissolution. Only oriented heteroepitaxial growth of Cr:$Mg_2GeO_4$ was observed on the surface of $Mg_2SiO_4$ crystal.

Figure 3:
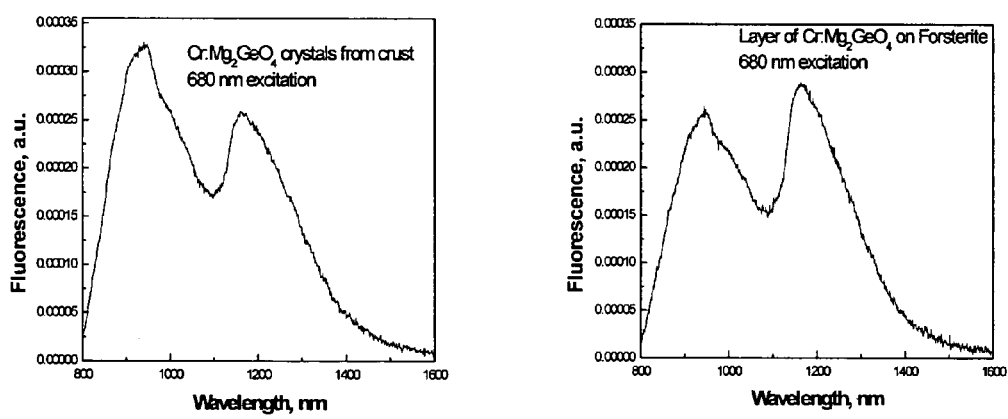
FIG. 3 presents fluorescence spectra for chromium-doped Mg$_2$GeO$_4$ in crystals formed in a liquid phase epitaxy solution (left) and on a Mg$_2$SiO$_4$ substrate (right)

Spontaneous crystallization of Cr:$Mg_2GeO_4$ was also observed in the high-temperature solution. Crystals up to 1 mm in size were formed on the surface as a crust for a period of 20 hours. Emission properties of crystals and layers grown in $Bi_2O_3$-based flux are shown in FIG. 3. Both crystals and layers exhibit $Cr^{3+}$ and $Cr^{4+}$ emission.

Figure 2:
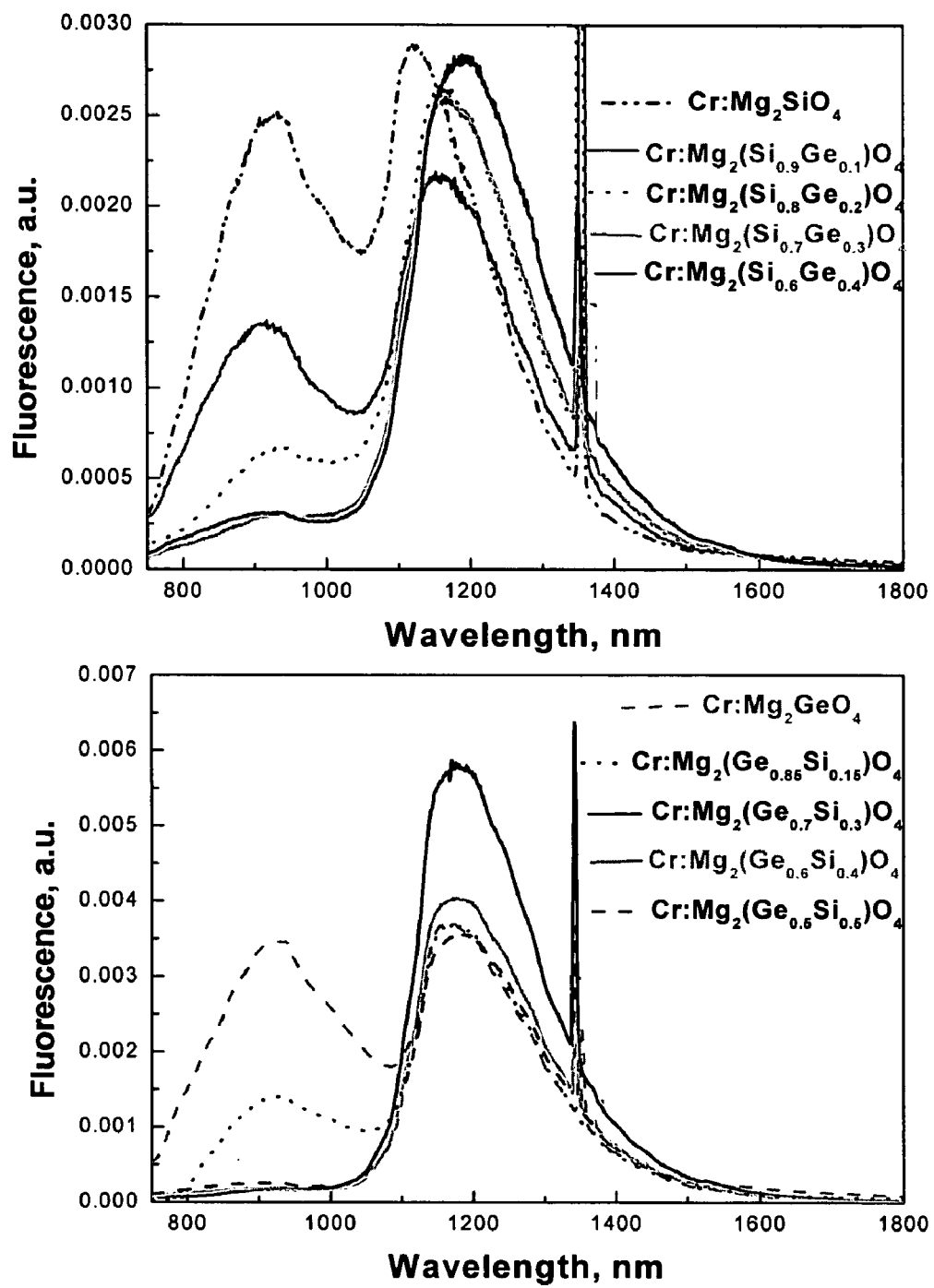
FIG. 2 presents fluorescence spectra for various chromium-doped Mg$_2$(Ge$_y$Si$_{1-y}$)O$_4$ powders.

As can be seen from FIGS. 1, 2, and 3 the fluorescence spectra of powder, single crystals, and epitaxial layers of Cr-doped $Mg_2GeO_4$ are similar, and all of them contain both $Cr^{3+}$ and $Cr^{4+}$ emission bands. The results of fluorescence measurements of Cr-doped mixed $Mg_2(Ge,Si)O_4$ compositions indicate that compositions containing mixtures of germanium and silicon ions have spectra similar to that of $Mg_2GeO_4$ and $Mg_2SiO_4$.

Figure 4A:
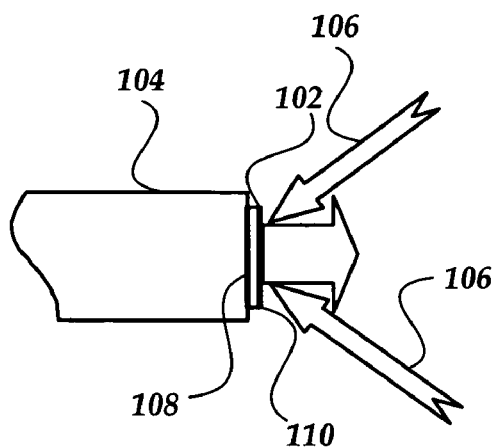
FIG. 4A is a schematic illustration of a first embodiment of a laser, according to the invention.
Figure 4B:
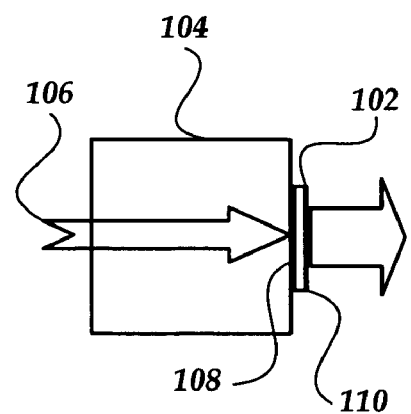
FIG. 4B is a schematic illustration of a second embodiment of a laser, according to the invention.

FIGS. 4A and 4B illustrate two different designs for using the laser medium in a thin disk of slab laser system depending on pumping geometry. In both concepts the dielectric mirror coatings 108, 110 on the disk itself define the resonator of the oscillator. In the first configuration (FIG. 4A), the cooled face of the disc 102 is optically coated to act as a total reflector, the disk is mounted on a heat sink 104 (e.g., a copper heat sink), and pumping light 106 is directed to the front disk surface. In another configuration (FIG. 4B), the cooled face of the disk 102 is transparent to pumping radiation and highly reflecting for laser emission, the laser disk is mounted on a transparent heat sink 104 (e.g., a sapphire heat sink) and axial back pumping light 106 is directed through the transparent sapphire heat sink.

In a modified version (FIG. 5) of the first configuration, the cooled face of the disk 102 (in this embodiment, a wedge slab) is optically coated to act as a total reflector. The wedge slab can be used as an active element to increase pump efficiency. The reflective coatings 108, 110 are on different components of the laser forming a resonator cavity 112. The disk 102 also includes an antireflective coating 114 on the surface that receives the pumping light 106.

Figure 5:
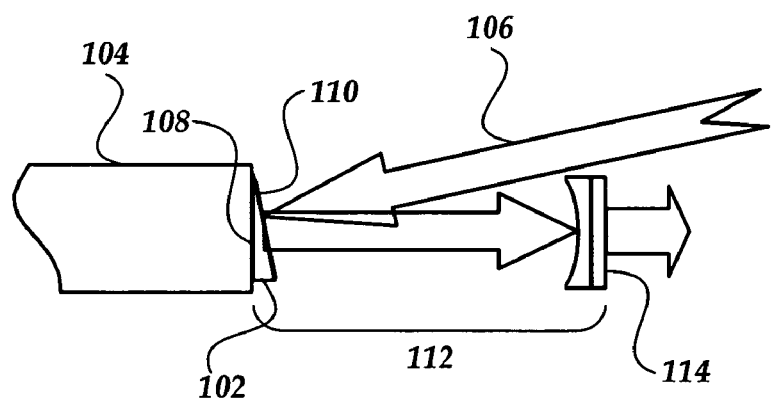
FIG. 5 is a schematic illustration of a third embodiment of a laser, according to the invention.
Figure 6A:
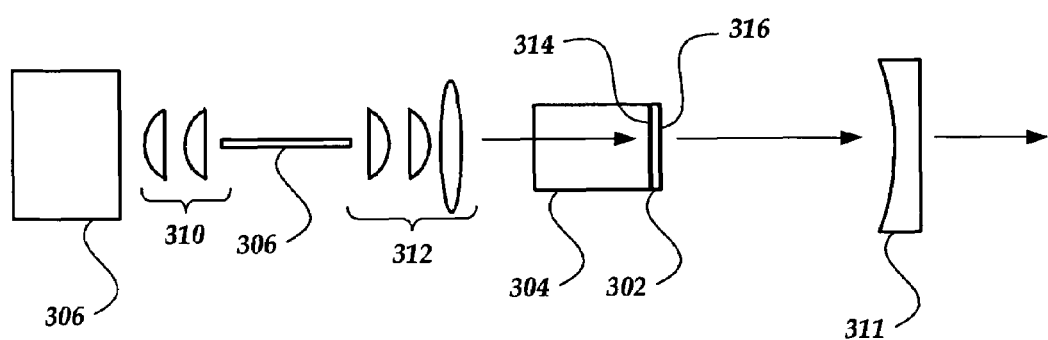
FIGS. 6A and 6B are schematic illustrations of two embodiments of laser systems, according to the invention.

A variety of lasers, including near infrared (NIR) lasers, can be formed using these materials, including, for example, lasers containing the arrangements schematically illustrated in FIGS. 4A, 4B, and 5. One example of a laser system that can be built as an all solid state compact laser with a thin $Mg_{2-x}M_xSi_{1-y}A_yO_4$ disk is schematically illustrated in FIG. 6A. At the heart of the laser is a $Mg_{2-x}M_xSi_{1-y}A_yO_4$ disk 302 disposed on a transparent heat sink 304 (e.g., a sapphire heat sink.) The disk is pumped with light from diode bars 306 (or any other suitable pumping light source.) For example, a laser diode stack consisting of a number bars can be used for pumping. Pumping light is delivered to the laser head by a planar waveguide 308. The radiation emitted by each bar was first collimated individually by a cylindrical microlens 310. A planar waveguide is used to shape the emitting beams of the laser diodes. Two cylindrical lenses 312 are used to focus the collimated diode laser beam into the planar waveguide. Using imaging optics, for example, cylindrical and spherical lenses, after the waveguide, a homogeneous pumping line is obtained and coupled into the $Mg_{2-x}M_xSi_{1-y}A_yO_4$ disk crystal through the transparent heat sink 304. The dielectric mirror coatings 314, 316 on the disk itself define the resonator of the oscillator. The cooling face of the disk attached to the heat sink is coated for high reflectivity at the laser wavelength and high transmission at the pumping wavelength, while the other side is high reflection coated for both wavelengths.

Figure 6B:
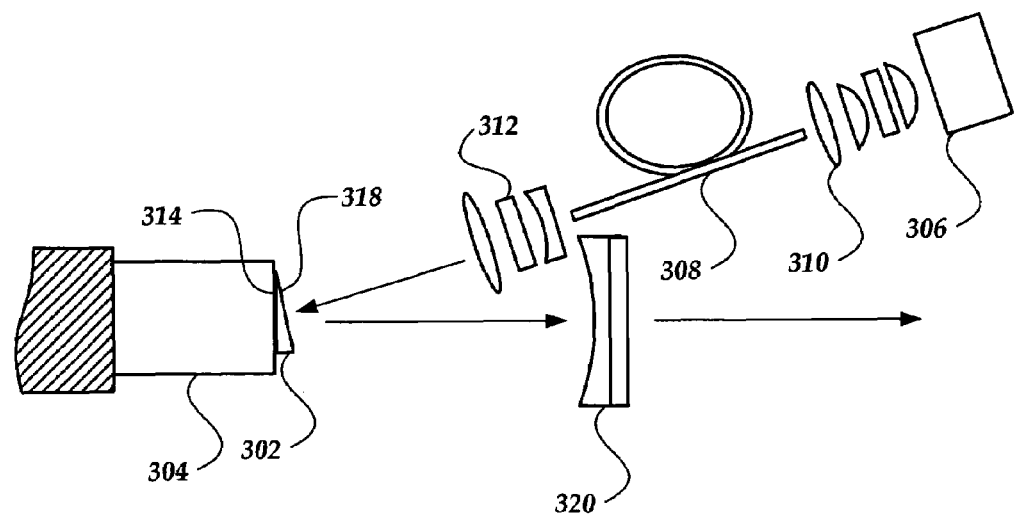

A second example is schematically illustrated in FIG. 6B, where a similar pump assembly (with laser diode bars 306, optics 310, 312, and waveguide 308) is used to pump a $Mg_{2-x}M_xSi_{1-y}A_yO_4$ wedge 302 from its front surface. Heat management in the gain medium (wedge) is central to successful operation of this laser and is provided by a heat sink 304 (e.g., a copper heat sink.) The wedge 302 includes a high reflective coating 314 on the back side near the heat sink 304 and an antireflective coating 318 on the front side. A coupler 320 is provided with a 95% reflective coating at the laser wavelength.

Figure 7:
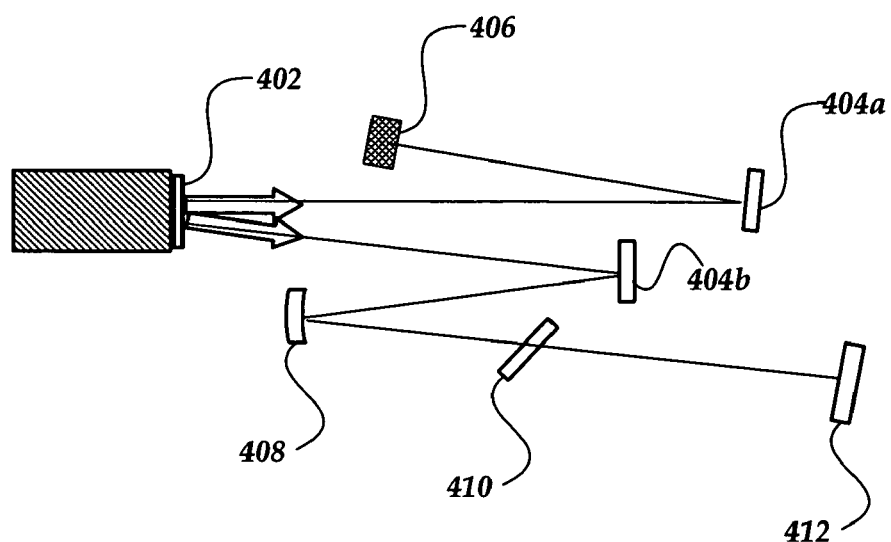
FIG. 7 is a schematic illustration of another embodiment of a laser system, according to the invention.

In another embodiment schematically illustrated in FIG. 7, for pulsed operation, the near-IR light from the laser head (e.g., laser disk 402) can then be directed through a series of dispersive mirrors 404a, 404b to a semiconductor saturable absorber mirror 406 that induces passive mode-locking. The laser light can pass through a mirror 408 and a tuning element 410 to an output coupler 412.

Figure 8:
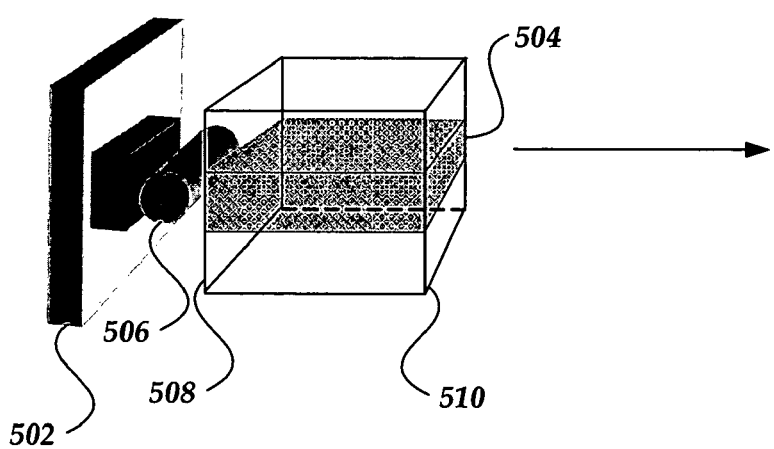
FIG. 8 is a schematic illustration of one embodiment of a waveguide laser/amplifier, according to the invention.

An example of a waveguide laser device is schematically illustrated in FIG. 8. A pump diode laser 502 provide pumping light through a coupling optic 506 to a waveguide 504 made of the $Cr^{4+}$ material described above. As an example, the waveguide has a coating 508 that is highly reflective at the laser frequency and highly transmissive at the pumping frequency and a second coating 510 that is 95% reflective at the laser frequency.

It will be recognized that these examples of lasers and waveguide laser devices can include more or fewer components or can be modified in accordance with known configurations of lasers and other devices.

The above specification, examples and data provide a description of the manufacture and use of the composition of the invention. Since many embodiments of the invention can be made without departing from the spirit and scope of the invention, the invention also resides in the claims hereinafter appended. The entire disclosure of each paper, patent, patent application, and other reference cited herein is incorporated herein by reference for all purposes.

What is claimed as new and desired to be protected by Letters Patent of the United States is:

1. A laser medium, comprising:
a single crystal of $Cr^{4+}:Mg_{2-x}M_xSi_{1-y}A_yO_4$, wherein
M is a bivalent ion having an ionic radius larger than $Mg^{2+}$,
A is a tetravalent ion having an ionic radius larger than $Si^{4+}$; and
either
a) $0 \leq x < 2$ and $0 < y < 1$; or
b) $0 < x < 2$ and y is 0 or 1 with the proviso that if M is $Ca^{2+}$ and x=1 then y is not 0.

2. The laser medium of claim 1, wherein A is selected from $Ge^{4+}$, $Ti^{4+}$, and $Zr^{4+}$.

3. The laser medium of claim 2, wherein M is selected from $Ca^{2+}$, $Sr^{2+}$, and $Ba^{2+}$.

4. The laser medium of claim 2, wherein $0.1 \leq y \leq 0.9$.

5. The laser medium of claim 1, wherein $0.1 \leq x \leq 1.9$.

6. The laser medium of claim 1, wherein the laser medium is disposed on a substrate comprising $Mg_2SiO_4$.

7. The laser medium of claim 1, wherein A is $Ge^{4+}$ and x is 0.

8. The laser medium of claim 1, wherein a concentration of $Cr^{4+}$ is at least 1 at. %.

9. A laser comprising:
a laser medium comprising a single crystal of $Cr^{4+}:Mg_{2-x}M_xSi_{1-y}A_yO_4$, wherein
M is a bivalent ion having an ionic radius larger than $Mg^{2+}$,
A is a tetravalent ion having an ionic radius larger than $Si^{4+}$; and
either
a) $0 \leq x < 2$ and $0 < y < 1$; or
b) $0 < x < 2$ and y is 0 or 1 with the proviso that if M is $Ca^{2+}$ and x=1 then y is not 0.

10. The laser of claim 9, wherein the laser is a near infrared laser.

11. The laser of claim 9, wherein the laser medium is a thin disk or thin wedge.

12. The laser of claim 9, further comprising a heat sink attached to a surface of the laser medium.

13. The laser of claim 9, further comprising a pump light source configured and arranged to provide pumping light to the laser medium.

14. The laser of claim 9, further comprising a tuning element to tune a frequency of light emitted by the laser medium.

15. The laser of claim 9, wherein the laser is continuous-wave mode-locked.

16. A method of making a laser medium, the method comprising:
   forming a solution comprising at least one substituent for forming the laser medium disposed in a solvent, wherein the at least one substituent is a metal oxide; and
   forming at least one crystal of $Cr^{4+}:Mg_{2-x}M_xSi_{1-y}A_yO_4$ from the solution, wherein M is a bivalent ion having an ionic radius larger than $Mg^{2+}$, A is a tetravalent ion having an ionic radius larger than $Si^{4+}$; and either a) $0 \leq x<2$ and $0<y<1$; or b) $0<x<2$ and y is 0 or 1 with the proviso that if M is $Ca^{2+}$ and x=1 then y is not 0.

17. The method of claim 16, wherein forming at least one crystal comprises forming a layer of $Cr^{4+}:Mg_{2-x}M_xSi_{1-y}A_yO_4$ on a substrate by liquid phase epitaxy.

18. The method of claim 17, wherein providing a substrate comprises providing a $Mg_2SiO_4$ substrate.

19. The method of claim 16, wherein forming at least one crystal of $Cr^{4+}:Mg_{2-x}M_xSi_{1-y}A_yO_4$, comprises forming at least one crystal of $Cr^{4+}:Mg_{2-x}M_xSi_{1-y}A_yO_4$, wherein A is selected from $Ge^{4+}$, $Ti^{4+}$, and $Zr^{4+}$.

20. The method of claim 16, wherein forming at least one crystal of $Cr^{4+}:Mg_{2-x}M_xSi_{1-y}A_yO_4$, comprises forming at least one crystal of $Cr^{4+}:Mg_{2-x}M_xS_{1-y}A_yO_4$, wherein M is selected from $Ca^{2+}$, $Sr^{2+}$, and $Ba^{2+}$.

21. The method of claim 16, wherein forming at least one crystal of $Cr^{4+}:Mg_{2-x}M_xSi_{1-y}A_yO_4$, comprises forming at least one crystal of $Cr^{4+}:Mg_{2-x}M_xS_{1-y}A_yO_4$, wherein $0.1 \leq y \leq 0.9$.

22. The method of claim 16, wherein forming at least one crystal of $Cr^{4+}:Mg_{2-x}M_xSi_{1-y}A_yO_4$, comprises forming at least one crystal of $Cr^{4+}:Mg_{2-x}M_xS_{1-y}A_yO_4$, wherein $0.1 \leq x \leq 1.9$.

* * * * *